(12) United States Patent
Albert et al.

(10) Patent No.: US 11,833,610 B2
(45) Date of Patent: Dec. 5, 2023

(54) LASER MACHINING SYSTEM

(71) Applicant: 3D-Micromac AG, Chemnitz (DE)

(72) Inventors: Sven Albert, Penig (DE); Torsten Leichsenring, Wildenfels (DE); Thomas Schmidt, Gera (DE); Uwe Wagner, Chemnitz (DE)

(73) Assignee: 3D-Micromac AG, Chemnitz (DE)

( * ) Notice: Subject to any disclaimer, the term of this patent is extended or adjusted under 35 U.S.C. 154(b) by 365 days.

(21) Appl. No.: 17/281,315

(22) PCT Filed: Sep. 20, 2019

(86) PCT No.: PCT/EP2019/075349
§ 371 (c)(1),
(2) Date: Mar. 30, 2021

(87) PCT Pub. No.: WO2020/069885
PCT Pub. Date: Apr. 9, 2020

(65) Prior Publication Data
US 2021/0402515 A1    Dec. 30, 2021

(30) Foreign Application Priority Data

Oct. 2, 2018    (DE) .................... 10 2018 216 940.3

(51) Int. Cl.
*B23K 26/064*    (2014.01)
*B23K 26/073*    (2006.01)
(Continued)

(52) U.S. Cl.
CPC ........ *B23K 26/0738* (2013.01); *B23K 26/067* (2013.01); *B23K 26/0643* (2013.01);
(Continued)

(58) Field of Classification Search
None
See application file for complete search history.

(56) References Cited

U.S. PATENT DOCUMENTS 5,440,423 A    8/1995    Ogura
8,946,594 B2    2/2015    Holmgren et al.
(Continued)

FOREIGN PATENT DOCUMENTS

CN    104777719 A    7/2015
CN    107433396 A    12/2017
(Continued)

OTHER PUBLICATIONS

Machine translation of DE102016006960 A1, Jun. 2023 (Year: 2023).*
(Continued)

*Primary Examiner* — Geoffrey S Evans
(74) *Attorney, Agent, or Firm* — DLA Piper LLP (US)

(57) ABSTRACT

A laser processing system includes a laser beam source that produces a raw laser beam; a beam expansion system that receives the raw laser beam and produces an expanded laser beam; a homogenization system that receives the expanded laser beam and produces a laser beam that is homogenized and has a line-shaped beam cross section in the processing plane, wherein the homogenization system includes a first homogenization arrangement that homogenizes along the short axis and a second homogenization arrangement for homogenization along the long axis, each of the homogenization arrangements includes optical elements that split the laser beam into a multiplicity of partial beams and a condenser system that superposes the partial beams in a superposition plane, and the first homogenization arrangement includes a first condenser system with at least one first mirror and the second homogenization arrangement includes a second condenser system with at least one second mirror.

15 Claims, 5 Drawing Sheets

(51) Int. Cl.
  *B23K 26/352* (2014.01)
  *B23K 26/06* (2014.01)
  *B23K 26/067* (2006.01)
(52) U.S. Cl.
  CPC ...... *B23K 26/0648* (2013.01); *B23K 26/0665* (2013.01); *B23K 26/352* (2015.10)

(56) References Cited

U.S. PATENT DOCUMENTS

| | | | |
|---|---|---|---|
| 10,661,384 | B2 | 5/2020 | Kumkar et al. |
| 2001/0010702 | A1* | 8/2001 | Tanaka ............... G02B 27/0983 372/99 |
| 2002/0191301 | A1 | 12/2002 | Tanaka |
| 2012/0153189 | A1 | 6/2012 | Wangler et al. |
| 2016/0276184 | A1* | 9/2016 | Wang ................ B23K 26/0006 |
| 2019/0018168 | A1 | 1/2019 | Ivanenko et al. |

FOREIGN PATENT DOCUMENTS

| | | | | |
|---|---|---|---|---|
| CN | 107515471 A | | 12/2017 | |
| DE | 10 2007 044 298 B3 | | 2/2009 | |
| DE | 102016006960 A1 | * | 12/2017 | ......... B23K 26/0006 |
| DE | 10 2017 210 241 A1 | | 12/2018 | |
| DE | 10 2017115 964 A1 | | 1/2019 | |
| EP | 0 939 341 A2 | | 9/1999 | |
| EP | 939341 A2 | * | 9/1999 | ......... G03F 7/70075 |
| EP | 1 122 020 A2 | | 8/2001 | |
| JP | S63-6540 A | | 1/1988 | |
| TW | 558861 B | | 10/2003 | |
| TW | 201320159 A | | 5/2013 | |
| TW | 201626050 A | | 7/2016 | |
| WO | 2011/012503 | | 2/2011 | |

OTHER PUBLICATIONS

Communication Under Article 94(3) dated Aug. 11, 2022, of counterpart European Patent Application No. 19 778 451.5, along with a machine translation.
Office Action dated Dec. 8, 2022, of counterpart Taiwanese Patent Application No. 108135696, along with an English translation.
Office Action dated May 8, 2023, of counterpart Taiwanese Patent Application No. 108135696, along with an English translation.

* cited by examiner

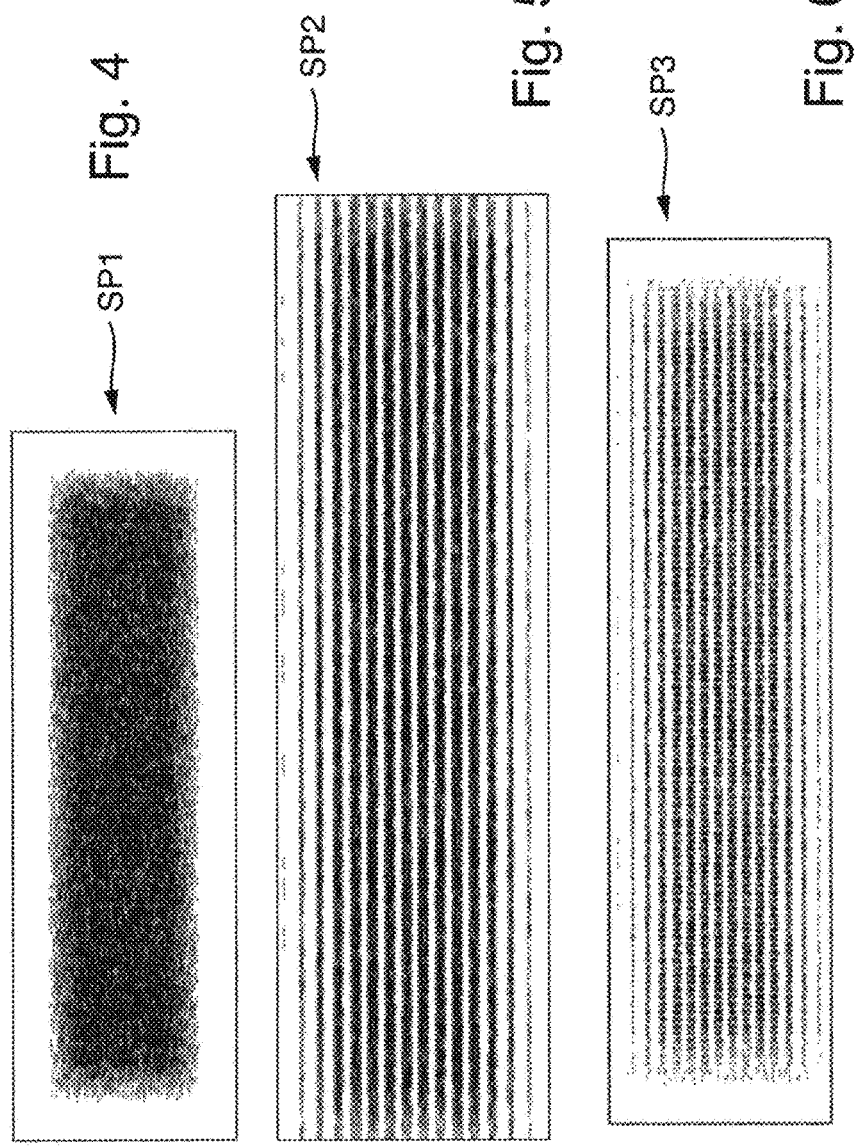

LASER MACHINING SYSTEM

TECHNICAL FIELD

This disclosure relates to a laser processing system that produces a laser beam with a line-shaped beam cross section.

BACKGROUND

When using such laser processing systems, a workpiece to be processed is arranged in the region of a processing plane and irradiated by the laser beam such that a more or less line-shaped "laser spot" arises on the surface of the workpiece to be processed. The beam cross section can be characterized by a short beam cross section axis (referred to as "short axis" or "short beam axis") and a long beam cross section axis (referred to as "long axis" or "long beam axis") perpendicular thereto.

Laser processing systems of this type that can produce a so-called line beam, are currently used, inter alia, in laser annealing and laser lift off processes. Typically, the width of the beam profile (as measured along the short axis) in such applications is significantly below 1 mm, for example, in the region of approximately 300 µm, while the length (as measured along the long axis) can be up to several 100 mm, for example, in the region of approximately 300 mm. Excimer lasers with wavelengths in the UV range, for example, at approximately 193 nm, 248 nm or 308 nm, are usually used as laser beam sources.

In laser annealing, a relative movement is produced between the laser beam and the workpiece in the direction perpendicular to the long axis, either by movement of the workpiece itself or moving the laser beam over the surface with the aid of a scanner. A combination of both movements is also possible. By way of example, the process is applied during the manufacture of flat panel displays. In the process, a layer of amorphous silicon is heated and melted by irradiation and converted into a polycrystalline Si layer when it re-solidifies. This increases the mobility of the charge carriers in the Si layer, ultimately leading to more efficient and more energy-saving displays. Other applications of laser annealing with line-shaped beam profiles include activation of dopants in a semiconductor layer or production of contacts in semiconductor components on SiC wafers (ohmic contact formation, OCF). The boundary layer between the SiC wafer and the metal layer situated thereon is melted so that a metal silicide arises in the region during cooling.

A relative movement is produced between the workpiece and the laser beam in laser lift off processes, in a manner similar to laser annealing. The workpiece to be processed consists of a layer stack connected to a growth substrate, e.g., a GaN layer system on a sapphire substrate. The layers are detached from the substrate by irradiating the boundary layer between the layer system and substrate and the layers can then be transferred to a further substrate (which might also be coated).

For precise processing, the intensity distribution in the beam cross section in the processing plane should be as uniform or homogeneous as possible. So-called flat-top beam profiles are usually sought after.

A generic laser processing system comprises a laser beam source that produces or emits a raw (not yet prepared) laser beam during operation, and devices for beam shaping and homogenization disposed downstream thereof. Such devices preferably include a beam expansion system disposed downstream of the laser beam source and receive the raw laser beam and produce an expanded laser beam. Disposed downstream of the beam expansion system there is a homogenization system that receives the expanded laser beam and produces from this a laser beam that is homogenized in relation to the light intensity distribution and has a line-shaped beam cross section in the processing plane.

The principle of beam shaping for a laser beam using microlens arrays or crossed cylindrical lens arrays is known. Imaging homogenization systems used in the process consist of two lens arrays arranged in succession and a condenser lens disposed downstream thereof. The first lens array divides the incident beam into partial beams and the second lens array, in combination with the downstream condenser lens, acts like an arrangement of individual objective lenses that superposes the images of the partial beams in a subsequent superposition plane (specifically the focal plane of the condenser lens). A homogenized flat-top beam profile can arise by superposition of the individual partial beams, which, when considered independently, are each inhomogeneous.

Generic laser processing systems are configured to homogenize the laser beam separately for the long axis and the short axis. This facilitates production of different beam dimensions in mutually perpendicular directions. To this end, the homogenization system comprises a first homogenization arrangement for homogenization along the short axis and a second homogenization arrangement for homogenization along the long axis. Each of the homogenization arrangements comprises optical elements that split the laser beam into a multiplicity of partial beams and a condenser system that superposes the partial beams in a superposition plane. The superposition plane can be the processing plane or a plane optically conjugate thereto.

DE 10 2007 044 298 B3 describes an arrangement for producing a laser beam with a line-like beam cross section that has a long and a short beam cross section axis, in which the laser beam emerging from a laser beam source is homogenized separately in respect of the long axis and the short axis.

There is a need to provide a laser processing system of the type described at the outset that operates stably over long periods of time, has a compact structure and offers a high degree of efficiency when using the energy of the utilized laser light source for processing.

SUMMARY

We thus provide a laser processing system in which the first homogenization arrangement (for the short axis) comprises a first condenser system with at least one first mirror and the second homogenization arrangement (for the long axis) comprises a second condenser system with at least one second mirror. Thus, one or more reflective optical components are used in each condenser system.

We recognized that conventional laser processing systems may have certain disadvantages if they are constructed exclusively with refractive components, i.e., in particular, with lenses and lens arrays. Cylindrical lens arrays and cylindrical lenses are usually used to produce a line beam. The downstream condenser lenses need to be large enough so that no partial beam is shadowed by the apertures thereof. Therefore, the clear apertures of the condenser lenses should usually be at least as large as those of the lens arrays. These generally need to have a relatively large thickness to be able to manufacture lenses with the required radii of curvature and clear apertures. The disadvantage thereof is that the optical losses are increased. As a result of unwanted reflections at the surfaces and absorption within the material, each optical element can cause a loss of laser energy of a few percent. Thus, optical losses of approximately 30% or more may arise over the entire beam path when a homogenization arrangement constructed entirely with refractive components is used. Moreover, the UV radiation can cause a degradation of the material of the lenses during operation, e.g., by producing color centers. This can lead to shortened service lives.

The aforementioned disadvantages can be reduced or avoided with our systems. The service lives of the optical units can be increased, the optical losses can be reduced, and the number of optical elements required can be limited. As a result of the reduced optical losses, a higher energy density can be attained on the workpiece in the same laser power and same beam profile. Consequently, a better degree of efficiency can be achieved. Alternatively, a longer beam profile with the same energy density can be produced.

A condenser system can be constructed with the aid of a combination of one or more lenses and one or more mirrors such that it is a catadioptric optical system. However, provision is preferably made for the first condenser system and the second condenser system to each be a catoptric optical system, i.e., constructed purely from mirrors and containing no lenses. This can particularly effectively avoid the disadvantages associated with lenses. Moreover, a particularly advantageous use of the available installation space is often possible.

Preferably, the first condenser system and/or the second condenser system comprises exactly two mirrors. In particular, a concave mirror and a convex mirror are combined. As a result, it is possible to realize a particularly compact structure with few potentially lossy optically functional surfaces (mirror surfaces).

The optical elements for splitting the laser beam into a multiplicity of partial beams may comprise a first cylindrical lens array and, disposed downstream thereof, a second cylindrical lens array for each of the axes such that the first and the second homogenization arrangement each form a (catadioptric) imaging homogenization system. As a result, it is possible, inter alia, to obtain a particularly good homogeneity over the beam cross section in the superposition plane. Alternatively, provision can be made for the optical elements for splitting the laser beam into a multiplicity of partial beams to comprise only a single cylindrical lens array for each of the axes, the cylindrical lens array forming a non-imaging homogenization system together with the downstream condenser system for the same axis.

It may be advantageous for many applications to obtain a relatively large aspect ratio between the lengths of the beam cross section along the long axis and the short axis. The aspect ratio is in the region of 100 or more in many configurations. By way of example, the aspect ratio can be 100 to 1000, but optionally also thereabove or therebelow.

Particularly high aspect ratios are facilitated in some configurations by virtue of the first condenser system being designed to produce a (real) intermediate image at a distance upstream of the processing plane and by virtue of an (optical) imaging system for imaging the intermediate image onto the processing plane being arranged between the intermediate image and the processing plane. This structure takes into account that the condenser systems for the long axis and the short axis may have very different focal lengths, particularly if high aspect ratios are sought after. This can be achieved in advantageous fashion with the aid of the intermediate imaging for the short axis.

In most configurations, the imaging system is designed to image the intermediate image into the processing plane without change in size in the first axis (1:1 imaging along the short axis). Alternatively, enlarging or reducing intermediate images are also possible in the short axis. The long axis is preferably not influenced by the imaging system.

The imaging system can be constructed with the aid of three or more mirrors. However, according to one example, the imaging system only comprises two mirrors, specifically a first mirror and exactly one second mirror. This results in a simple structure with few components. The first mirror can have a concave mirror surface and the second mirror can have a convex mirror surface.

It may be particularly advantageous if the imaging system has a symmetric structure. What can be achieved thereby is that typical image aberrations which may arise due to the use of curved mirrors such as coma, are compensated within the imaging system on account of the symmetric structure. Consequently, the imaging of the intermediate image onto the processing plane can be largely free of geometric image aberrations.

A particularly advantageous design arises if the first mirror has a focal length that corresponds to the distance between the first mirror and the second mirror and to twice the focal length of the second mirror, wherein, furthermore, a distance between the imaging system and the intermediate image corresponds to twice the focal length of the first mirror.

In one example, the imaging system is arranged and constructed such that the laser beam is reflected from a first region of the first mirror to the second mirror and from the second mirror to a second region of the first mirror. Thus, the first mirror is used twice. The first and the second region can partly overlap one another or be located at a distance from one another without mutual overlap.

At least one plane deflection mirror may be arranged in the beam path between the laser source and the processing plane, i.e., at least one plane mirror without refractive power. Improved installation space use and a compact structure are possible as a result of using at least one plane deflection mirror. If necessary, certain beam properties can be controlled by adjusting an inclination of a deflection mirror, for example, within the scope of an adjustment.

In some configurations, a deflection mirror is optically arranged between the last optical element with refractive power and the processing plane. Consequently, the deflection mirror is the last optical element that changes the course of the beam in the beam path immediately upstream of the processing plane. This deflection mirror can be fixedly assembled such that there is no mobility apart from an adjustment option. In other examples, this deflection mirror is movably mounted and pivotable in a controlled manner. Then, the deflection mirror can be used as a scanner mirror and thus assumes a double function.

As an alternative or in addition thereto, a deflection mirror can also be provided at a different position within the beam path. In configurations which produce an intermediate image for the short axis, which is imaged into the processing plane by an imaging system, a deflection mirror can be arranged upstream of this imaging system. In particular, the deflection mirror can be arranged between the intermediate image and the imaging system. As a result, there are greater degrees of freedom for the arrangement and alignment of the imaging system.

In all configurations, a preferably exchangeable protective glass can be provided directly upstream of the processing plane, which protective glass should allow the laser beam to pass through as unhindered and as unchanged as possible. The protective glass, which may have the form of a plane plate, for example, can prevent particles or vapors arising during the laser processing from depositing on the mirrors. Instead, everything lands on the protective glass, which can simply be replaced when necessary.

It may be desirable to be able to alternatively create line beams with different dimensions in the longitudinal direction (long axis) and/or width direction (short axis) for different applications using one laser processing system. In some configurations, production of a line beam with different dimensions is simplified by virtue of the optical elements that serve to produce the multiplicity of partial beams and are found in the first homogenization arrangement and/or in the second homogenization arrangement being structurally exchangeable, wherein these optical elements are preferably combined in an assembly that is exchangeable as a whole. As a result, a conversion to other line dimensions and/or other aspect ratios is relatively easily possible by exchanging these optical elements. There is no need to exchange the condenser systems and the imaging system for the short axis to this end.

Preferably, the laser processing system is designed such that the line beam or the beam cross section in the processing plane is characterized in that the profile thereof both along the long axis and along the short axis has a flat top shape with virtually constant energy density over the greatest part of the beam profile and a virtually perpendicular drop of the energy density in the outer region, wherein, preferably, a homogeneity deviation is 4% or less along the short axis and/or a homogeneity deviation is 1.5% or less along the long axis. This allows particularly precise processing processes.

BRIEF DESCRIPTION OF THE DRAWINGS

Further advantages arise from the appended claims and the following description of preferred examples, that are explained below on the basis of the figures.

FIGS. 4 to 9 show characteristic beam profiles at different positions along the beam path.

DETAILED DESCRIPTION

Examples of laser processing systems that produce a laser beam with a line-shaped beam cross section with a short axis (short beam cross section axis) and a long axis (long beam cross section axis) perpendicular thereto in a processing plane are described below. Laser processing systems of this type can be used, for example, in laser annealing and laser lift-off processes, but also in other applications. In relation to the system coordinate system KS, the long axis extends parallel to the x-direction, the short axis extends parallel to the y-direction and the z-axis extends perpendicular to the processing plane 105. The processing plane is the plane in which the beam profile has the desired properties (in particular, aspect ratio and energy distribution). A workpiece to be processed is arranged such that, as a rule, the workpiece surface to be processed lies in the processing plane or in the direct vicinity thereof.

When the terms "in front of," "behind," "upstream," "downstream," "between" and the like are used in the description of the relative arrangement of optical elements with respect to one another, this means the relative arrangement along the beam propagation direction. The relative geometric arrangement, i.e., the arrangement in the installation space, can deviate therefrom.

Figure 1:
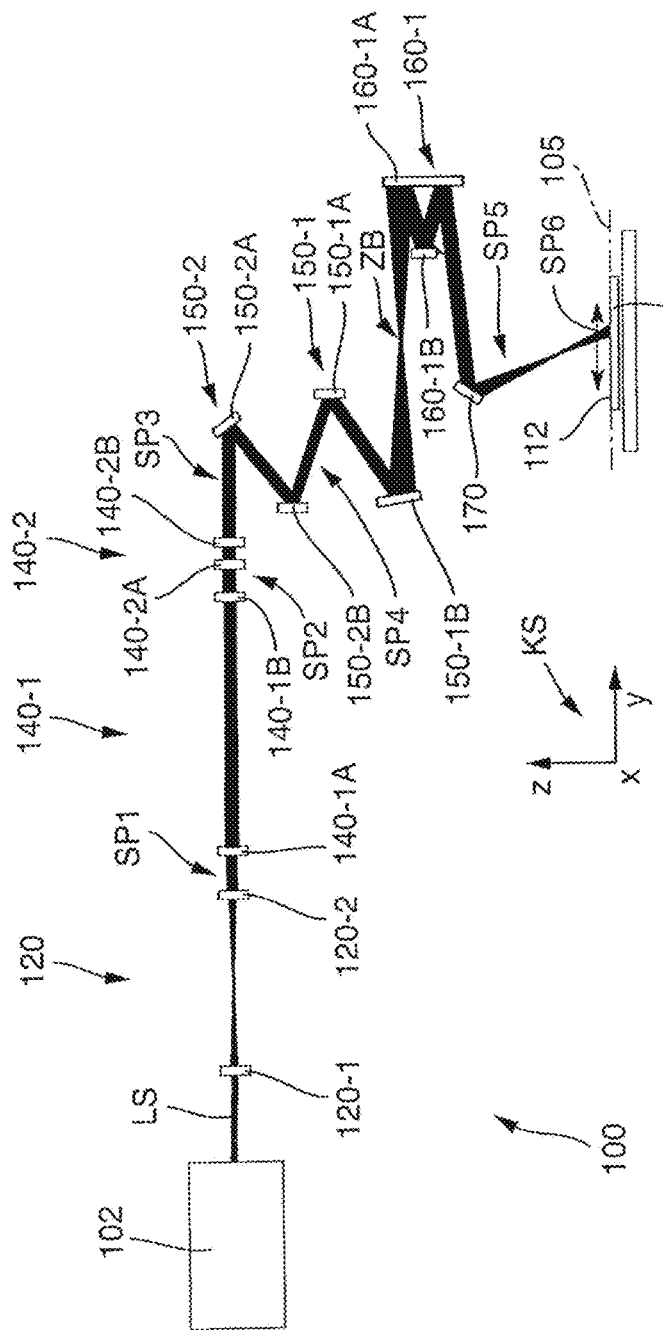
FIG. 1 schematically shows the structure of a laser processing system and of the beam path in a first example.

FIG. 1 schematically shows the structure of a laser processing system 100 and of the beam path, which a laser beam LS traverses from the laser beam source 102 to the processing plane 105, in which the surface 112 of a workpiece 110 to be processed is arranged.

The laser beam is emitted by the laser beam source 102 as a raw, i.e., not yet prepared laser beam (also referred to as raw beam) and is subsequently expanded and collimated by a downstream beam expansion system 120 in the form of a telescope. Subsequently, the expended laser beam is homogenized by an imaging homogenizer and imaged or focused on the workpiece 110 in the region of the surface 112 thereof by the optical system.

In this example, the laser beam source 102 is an excimer laser with a wavelength of 308 nm and a pulse energy of approximately 1000 mJ. The emitted laser beam (raw beam) has an approximately rectangular profile with the length ranging from 30-40 mm and a width of 10-15 mm. Instead of 308 nm, the wavelength could also be, for example, 248 nm or 193 nm or any other UV wavelength.

Figure 2:
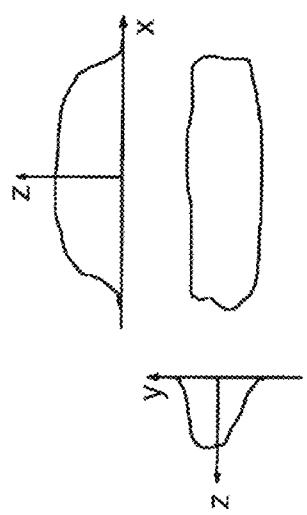
FIG. 2 shows a schematic illustration of the energy distribution of the raw beam immediately after emergence from the laser beam source.

A schematic illustration of the raw beam is shown in FIG. 2. The raw beam has an approximately rectangular profile, with a cross section along the short axis having a Gaussian-like energy distribution. By contrast, the energy distribution along the long axis already exhibits a greater homogeneity.

Initially, the raw beam is expanded by the telescope. The beam expansion system 120 or the telescope 120 consists of two planoconvex cylindrical lenses 120-1, 120-2, the spacing of which corresponds to the sum of the two focal lengths (Kepler telescope). The cylindrical lenses are oriented such that the laser beam is expanded along the long axis (parallel to the x-direction) while there is no expansion perpendicular thereto along the short beam axis. The expansion is implemented to illuminate the downstream homogenization array well—the laser beam should cover as many of the microlenses of the homogenization array as possible for a good beam homogenization. In this example, the width of the laser beam is increased from approximately 50 mm in front of the first telescope lens 130-1 to approximately 90 mm in the region behind the telescope.

Alternatively, the beam expansion system can also have, for example, a Galilean telescope with a planoconvex and a planoconcave side. This can be advantageous, for example, for better utilization of the installation space.

The actual beam shaping is implemented by a subsequent homogenization system that receives the expanded laser beam and produces a laser beam that is homogenized in relation to the light intensity distribution and has a line-shaped beam cross section in the processing plane 105. The homogenization system comprises an arrangement, following the beam expansion system, of cylindrical lens arrays and condenser systems, that form a separate imaging homogenizer or a separate homogenization arrangement for each of the axes. In this example, the homogenization for the two axes (short and long axis) is implemented separately or independently of one another, each with a dedicated arrangement of lens arrays and downstream condenser/focusing optical unit.

This can also be described by virtue of the homogenization system having a first homogenization arrangement for homogenization along the short axis and a second homogenization arrangement for homogenization along the long axis or by virtue of the homogenization system being configured to separately homogenize the laser beam for the long axis and the short axis. Each of the two homogenization arrangements comprises optical elements that split the laser beam into a multiplicity of partial beams (generally denoted by reference sign 140x) and a condenser system (generally denoted by reference sign 150x) that superposes the partial beams in a superposition plane. Relatively high aspect ratios can be obtained with relatively simple optical structures if separate systems are used for both axes.

Each superposition is implemented in the focal plane of the respective condenser system. This focal plane corresponds to the processing plane only for the long axis. For the short axis, an instance of imaging (with the aid of the imaging system 160-1) is disposed downstream of the focal plane of the condenser system and images the focal plane onto the processing plane.

Structure and function of the example can also be described as set forth below.

Following the telescope of the beam expansion system 120, two cylindrical lens arrays 140-1A, 140-1B are placed into the beam path first and these serve as optical elements 140-1 for splitting the laser beam into a multiplicity of partial beams for the short axis. These cylindrical lens arrays can either consist of cylindrical lenses that were manufactured individually and subsequently strung together or else be manufactured from a single substrate that may have been processed, e.g., mechanically and/or by an etching process. In this example, use is made of a spherical profile of the cylindrical lenses. Since the raw beam of the laser is oriented horizontally (or in the xy-plane), i.e., the long beam axis is horizontal, the cylindrical lenses of these arrays are also oriented horizontally with their cylinder axes, specifically such that the longer sides of the individual lenses extend parallel to the long side of the beam profile. To achieve good homogeneity of the output beam (incident on the processing plane), the greatest possible number of cylindrical lenses should be illuminated by the incident laser beam. The width of an individual cylindrical lens is approximately 1.3 mm in this example while the beam dimension along the short beam axis is approximately 24 mm at this point of the beam path. Both arrays consist of planoconvex cylindrical lenses with a radius of curvature of 240 mm.

The cylindrical lens arrays 140-1A, 140-1B and an associated reflective first condenser system 150-1, described below, produce an intermediate image ZB, homogenized along the short axis, at a distance of approximately 400 mm downstream of the condenser system 150-1.

Following the cylindrical lens arrays 140-1A, 140-1B for the short axis in the beam path there are two cylindrical lens arrays 140-2A and 140-2B that serve as optical elements 140-2 for splitting the laser beam into a multiplicity of partial beams for the long axis. The cylindrical lenses are oriented perpendicular to the cylindrical lenses 140-1A, 140-1B for the short axis and have a width of approximately 1.3-1.5 mm. To reduce imaging aberrations by the cylindrical lenses and improve the homogeneity, particularly along the long axis, the lenses of the array 140-2B have an aspherical profile with a conic constant ranging from −4 to 0. Spherical profiles are provided in other variants.

Depending on the desired length of the line beam (along the long axis), different combinations of radii of curvature are possible. By way of example, the radii of curvature of the lenses of the first and the second cylindrical lens array can be 20 mm and 5 mm, respectively, to produce a beam with a length of approximately 300-370 mm, or 12 mm and 20 mm, respectively, for a line beam with a length of approximately 70-110 mm. Other radii of curvature or combinations and other line beam lengths are also possible.

The first cylindrical lens array 140-2A for the long axis may be placed immediately downstream of the second cylindrical lens array 140-1B for the short axis.

As a result of the cylindrical lens arrays, the laser beam is split, separately for each of the axes, into a large number of partial beams.

Figure 3:
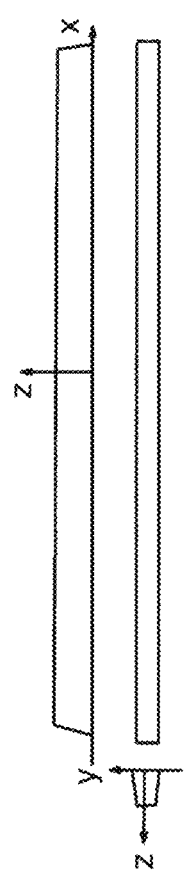
FIG. 3 shows a schematic illustration of the energy distribution of the laser beam in the processing plane in accordance with a flat-top profile.
Figure 7:
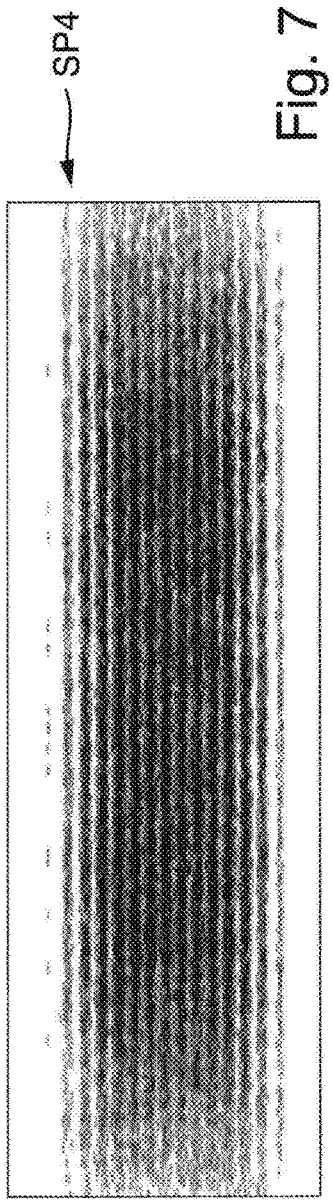
Figure 8:
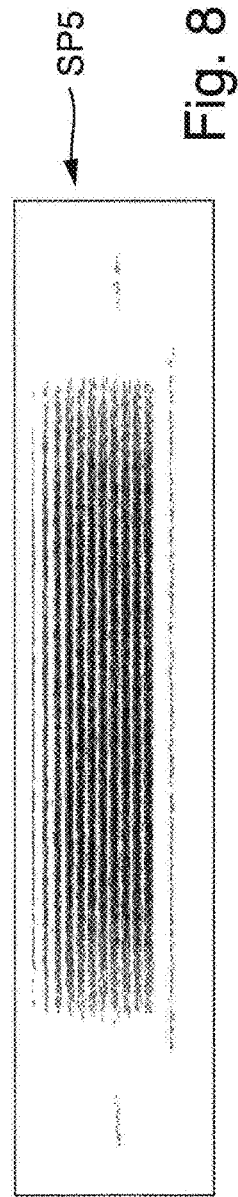
Figure 9:
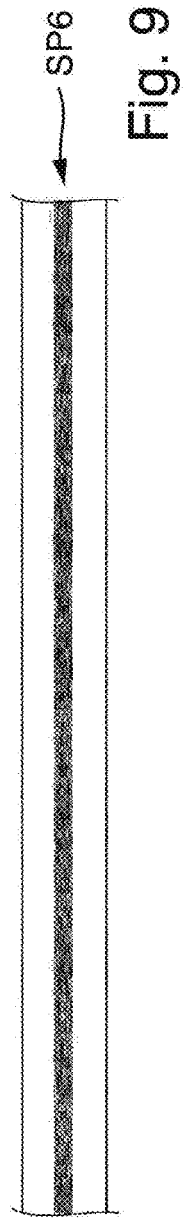

The condenser systems, that superpose these partial beams again, each consist of two cylindrical mirrors in this example, i.e., they are catoptric optical systems. In a region of up to a few 100 μm around the focal plane of the respective condenser systems along the beam propagation direction, the beam profile, when considered along the corresponding axis, exhibits a flat-top characteristic, i.e., a beam cross section with a virtually constant energy density over the majority of the beam profile and steep edges in the outer regions. Then, the partial beams diverge again at greater distances from the focus. FIG. 3 schematically shows the intensity distribution in a flat-top profile.

In this example, the size of the flat-top profile depends on the focal length fc of the condenser optical unit or of the condenser system, the focal lengths $f_1$ and $f_2$ of the lens arrays, the distance d between the arrays and the pitch p, i.e., the width of the individual lenses of the arrays:

$$D = \frac{pfc}{f_1 f_{2_1}}(f_1 + f_2 - d).$$

A peculiarity of the example consists of arrangements with curved mirrors being used as condenser systems instead of using refractive condenser systems made of known lenses. The first homogenization arrangement (for the short axis) comprises a first condenser system 150-1 with first mirrors 150-1A and 150-1B and the second homogenization arrangement (for the long axis) comprises a second condenser system 150-2 with second mirrors 150-2A and 150-2B.

This measure promises a greater overall transmission of the system since the losses only occur at the highly reflective coatings (HR coatings) of the mirror substrates instead of, as in lenses, the losses occurring both at the entry and exit faces and further losses occurring due to the absorption in the material of the lenses. Moreover, the demands on the substrate material of transmissive elements are higher than on mirror substrates. This results in lower costs for the reflective optical units compared to transmissive elements. By avoiding absorption in the material of the optical units, the service life of the optical units also increases. Overall, this yields a significant reduction in the costs per workpiece processed.

On account of the sought-after great difference in the desired beam dimensions along the long and short axes on the workpiece (aspect ratio ranging from 100 to 1000, for example), it is advantageous to use a dedicated condenser optical unit or a dedicated condenser system with a different focal length for each of the two axes. In this example, the focal length of the first condenser system 150-1 (i.e., the condenser optical unit for the short axis) is approximately 150 mm while it is 2430 mm for the second condenser system 150-2 (for the long axis).

For both the short and the long axis, the associated condenser system consists of two cylindrically curved mirrors, specifically a concave mirror and a convex mirror. Like in the lens arrays previously described, the directions of curvature of the condenser mirrors for the long axis are oriented perpendicular to the directions of curvature of the condenser mirrors for the short axis. The axis that describes the respective center of curvature of the mirrors is oriented horizontally (parallel to the x-direction) for the condenser mirrors of the short axis and perpendicular thereto for those of the long axis.

The condenser optical unit for the long beam axis, i.e., the second condenser system 150-2, consists of the concave mirror 150-2A and the convex mirror 150-2B, that are arranged in the beam path downstream of the cylinder arrays 140*x* of the optical elements 140-1, 140-2. The laser beam subsequently strikes the convex mirror 150-1A and the concave mirror 150-1B, that together form the condenser optical unit for the short beam axis or the first condenser system 150-1.

As a result of the great difference in the focal lengths of the condenser systems, the homogeneous regions produced by the two homogenization arrangements arise at clearly different locations of the beam path—the first homogenization arrangement (for the short axis) already produces an intermediate image ZB at a small distance downstream of the second condenser mirror 150-1B while the homogenization arrangement for the long axis produces the homogeneous region at a significantly greater distance, specifically in the processing plane 105. In this example, the distance between the focal planes of the short and long axis is approximately 1440 mm.

Since the two homogeneous regions must be superposed in the workpiece plane or in the processing plane 105, the intermediate image ZB of the short axis is imaged into the processing plane by an imaging system 160-1. The focal length of the condenser optical unit of the long axis may be chosen such that the sum of the distance between the two principal planes of the condenser optical units for the two beam axes corresponds to the focal length of the condenser optical unit for the short beam axis and the transmission length of the imaging system 160-1 (sum of object and image distance).

The imaging optical unit or the imaging system 160-1 for the short axis consists of the two mirrors 160-1A and 160-1B, i.e., comprises exactly two mirrors. The arrangement is such that the laser beam is reflected twice at the first mirror 160-1A. This first mirror is a relatively large cylindrical concave mirror, which steers the laser beam at the second, smaller convex mirror 160-1B, from where the beam is reflected back again on the first mirror 160-1A. In this example, different, non-overlapping regions of the concave mirror surface of the first mirror 160-1A are used in the process. Since the laser beam strikes the first mirror 160-1A twice, the mirror arrangement of the imaging system 160-1 can be considered to be the equivalent of a three-lens transmissive objective. The imaging scale of the imaging system 160-1 for the short axis is 1:1, i.e., the intermediate image ZB for the short axis is transferred to the workpiece (into the processing plane 105) without change in size. The beam path for the long axis is not altered by the imaging system 160-1. The focal length of the first mirror 160-1A corresponds to the distance between the two mirrors and twice the focal length of the second mirror 160-1B. The distance between the objective or the imaging system and the intermediate image ZB corresponds to twice the focal length of the first mirror 160-1A. As a result of the symmetric structure, many image aberrations that arise due to the first reflection at the first mirror 160-1A, in particular coma aberrations, are compensated by the incidence on the second mirror 160-1B and the second reflection at the first mirror 160-1A.

From the imaging system 160-1, the laser beam is steered via a plane deflection mirror 170 onto the workpiece. In a suitable arrangement of the mirrors of the condenser systems, the beam can also strike the workpiece directly without the use of a deflection mirror. The deflection mirror 17 is fixedly assembled. The deflection mirror can also be replaced by a movable deflection mirror which, in conjunction with an (optional, not illustrated) F-theta lens, moves the laser beam over the workpiece, for example, by way of the mirror of a galvanometer scanner or a polygon mirror.

Using the beam profiles SP1 to SP6 in FIGS. 4 to 9, the optical effect of the individual components on the intensity distribution in the beam cross section at successive positions (denoted SP1 to SP6 in FIG. 1) along the beam propagation is shown. The beam profile SP1 represents the beam profile downstream of the telescope, i.e., after the beam expansion system 120. The expanded beam SP1 is split into parallel lines by the arrays 140-1A, 140-1B for the short axis (beam profile SP2) and, subsequently, the lines are split into rectangular partial beams by the arrays 140-2A, 140-2B for the long axis perpendicular thereto (beam profile SP3). The partial beams are superposed again over a relatively long path as a result of the condenser systems 150-1, 150-2 and the imaging optical unit 160. Beam profile SP4 is present downstream of the condenser system 150-2 for the long axis and beam profile SP5 is present downstream of the imaging optical unit 160. The last beam profile SP6 shows a section of the line beam in the processing plane 105 or on the workpiece surface.

Figure 10:
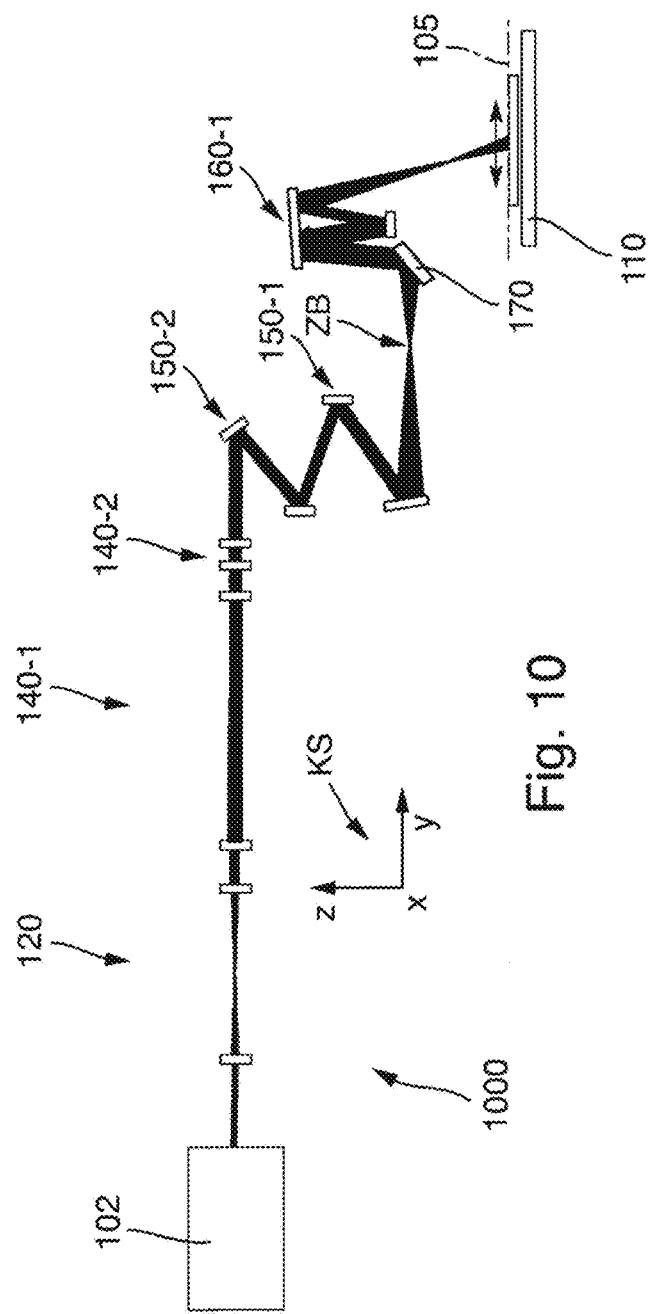
FIG. 10 schematically shows the structure of a laser processing system and of the beam path in a second example.

Other arrangements are possible. In the example of a laser processing system 1000 in FIG. 10, the same or similar components as in the system 100 of FIG. 1 have been denoted by the same reference signs. As shown, the deflection mirror 170 can also be arranged upstream of the objective 160, i.e., upstream of the imaging system 160. By way of example, the beam deflection can facilitate a perpendicular or virtually perpendicular arrangement of the imaging system 160, as a result of which a better utilization of the available installation space may be achieved in certain circumstances. In this example, the laser beam coming from the objective 160 directly strikes the workpiece without a further deflection. A second deflection mirror can additionally be provided between objective and workpiece.

To produce the relative movement between laser beam and workpiece, the workpiece 110 is moved linearly in a plane (xy-plane) at an angle to the plane of the incident beam. The oblique incidence ensures that back reflections from the workpiece surface cannot reach the beam path of the laser processing system. Ideally, the line beam produced covers the entire width of the workpiece to be processed or the region of the workpiece to be processed such that the workpiece need only be moved along one axis.

The desired line beam on the workpiece arises on account of the described optical systems for the short and the long axis. In some examples, including the examples shown here, the line beam has a length of 300-370 mm and a width of 330 μm. However, the production of a line beam with other dimensions, e.g., 70-110 mm length, is possible by exchanging the cylindrical lens arrays 140-1x, 140-2x while, at the same time, re-using the condenser systems 150x and the imaging system 160-1.

In the examples, the line beam is characterized in that its profile has a flat-top shape (virtually constant energy density over the majority of the beam profile, virtually perpendicular drop in the energy density in the outer regions) both along the long and along the short beam axis, with a homogeneity deviation of <4% along the short axis or even <1.5% along the long axis. The beam profile on the workpiece is shown schematically in FIG. 3 (the aspect ratio of the line beam is, however, not true to scale in the drawing).

One beam expansion system is provided in each of the illustrated examples. The object of the beam expansion is that of producing a beam that fills the first homogenizer array to the best possible extent. As many microlenses as possible should be "struck" by the incident beam since the homogeneity of the output beam becomes better as more microlenses are covered by the incident beam. As a rule, the homogeneity is poorer without beam expansion. In principle, a homogenizer can also be used without upstream beam expansion. Consequently, if the demands on the homogeneity are not too great, it might be possible to dispense with a beam expansion upstream of the beam being split, i.e., dispense with a beam expansion system disposed downstream of the laser beam source and serving to receive the raw laser beam and produce an expanded laser beam.

Imaging homogenization systems are provided in each of the examples illustrated. An imaging homogenization system or an imaging homogenizer comprises two lens arrays and a downstream condenser system. In an imaging homogenizer, the lenses of the second lens array image the corresponding lens apertures of the first lens array and these individual images are then superposed by the condenser system in its focal plane. Alternatively, a non-imaging homogenizer (or a non-imaging homogenization system) can also be provided. A non-imaging homogenizer consists of only one lens array and a downstream condenser system. In general, non-imaging homogenizers are particularly well-suited to the illumination of areas that are as large as possible while imaging homogenizers can attain a better homogeneity. The line size can be varied more easily in imaging homogenization systems, for example, by changing the distance of the lens arrays. This can also be used to compensate manufacturing tolerances.

The invention claimed is:

1. A laser processing system that produces a laser beam with a line-shaped beam cross section with a short axis and a long axis perpendicular thereto in a processing plane, comprising:
   a laser beam source that produces a raw laser beam;
   a beam expansion system disposed downstream of the laser beam source that receives the raw laser beam and produces an expanded laser beam;
   a homogenization system disposed downstream of the beam expansion system that receives the expanded laser beam and produces a laser beam that is homogenized in relation to the light intensity distribution and has a line-shaped beam cross section in the processing plane,
   wherein the homogenization system comprises a first homogenization arrangement that homogenizes along the short axis and a second homogenization arrangement for homogenization along the long axis,
   each of the homogenization arrangements comprises optical elements that split the laser beam into a multiplicity of partial beams and a condenser system that superposes the partial beams in a superposition plane, wherein the condenser system is arranged optically downstream of the optical elements that split the laser beam into a plurality of partial beams, and
   the first homogenization arrangement comprises a first condenser system with at least one first mirror and the second homogenization arrangement comprises a second condenser system with at least one second mirror.

2. The laser processing system as claimed in claim 1, wherein the first condenser system and the second condenser system are embodied as catoptric optical systems.

3. The laser processing system as claimed in claim 1, wherein the first condenser system and/or the second condenser system comprises exactly two mirrors.

4. The laser processing system as claimed in claim 1, wherein the optical elements that split the laser beam into a multiplicity of partial beams comprise a first cylindrical lens array and, disposed downstream thereof, a second cylindrical lens array for each of the axes such that the first and the second homogenization arrangement each form an imaging homogenization system.

5. The laser processing system as claimed in claim 1, wherein an aspect ratio between lengths of the beam cross section along the long axis and the short axis is 100 or more.

6. The laser processing system as claimed in claim 1, wherein the first condenser system produces a real intermediate image at a distance upstream of the processing plane and an imaging system that images the intermediate image onto the processing plane is arranged between the intermediate image and the processing plane.

7. The laser processing system as claimed in claim 6, wherein the imaging system has one or more of:
   (i) the imaging system images the intermediate image into the processing plane without changing the size in the short axis;
   (ii) the imaging system comprises a first mirror and exactly one second mirror, wherein, optionally, the imaging system is arranged and constructed such that the laser beam is reflected from a first region of the first mirror to the second mirror and from the second mirror to a second region of the first mirror; and
   (iii) the imaging system has a symmetrical structure.

8. The laser processing system as claimed in claim 1, wherein at least one plane deflection mirror is arranged in the beam path between the laser source and the processing plane.

9. The laser processing system as claimed in claim 8, wherein the deflection mirror is optically arranged between a last optical element with refractive power and the processing plane.

10. The laser processing system as claimed in claim 9, wherein the deflection mirror is movably mounted and pivotable in a controlled manner.

11. The laser processing system as claimed in claim 6, wherein a plane deflection mirror is arranged upstream of the imaging system or between the intermediate image and the imaging system.

12. The laser processing system as claimed in claim 1, wherein the optical elements that produce the multiplicity of partial beams and are found in the first homogenization arrangement and/or in the second homogenization arrangement are structurally exchangeable, and the optical elements are optionally combined in an assembly that is exchangeable as a whole.

13. The laser processing system as claimed in claim 1, wherein the beam cross section in the processing plane has a flat-top form along the long axis and along the short axis, and a homogeneity deviation along the short axis is 4% or less and/or a homogeneity deviation along the long axis is 1.5% or less.

14. A laser processing system that produces a laser beam with a line-shaped beam cross section with a short axis and a long axis perpendicular thereto in a processing plane, comprising:

a laser beam source that produces a raw laser beam;

a beam expansion system disposed downstream of the laser beam source that receives the raw laser beam and produces an expanded laser beam;

a homogenization system disposed downstream of the beam expansion system that receives the expanded laser beam and produces a laser beam that is homogenized in relation to the light intensity distribution and has a line-shaped beam cross section in the processing plane, wherein the homogenization system comprises a first homogenization arrangement that homogenizes along the short axis and a second homogenization arrangement for homogenization along the long axis, each of the homogenization arrangements comprises optical elements that split the laser beam into a multiplicity of partial beams and a condenser system that superposes the partial beams in a superposition plane, and the first homogenization arrangement comprises a first condenser system with at least one first mirror and the second homogenization arrangement comprises a second condenser system with at least one second mirror, wherein the optical elements that split the laser beam into a multiplicity of partial beams comprise a first cylindrical lens array and, disposed downstream thereof, a second cylindrical lens array for each of the axes such that the first and the second homogenization arrangement each form an imaging homogenization system.

15. A laser processing system that produces a laser beam with a line-shaped beam cross section with a short axis and a long axis perpendicular thereto in a processing plane, comprising:

a laser beam source that produces a raw laser beam;

a beam expansion system disposed downstream of the laser beam source that receives the raw laser beam and produces an expanded laser beam;

a homogenization system disposed downstream of the beam expansion system that receives the expanded laser beam and produces a laser beam that is homogenized in relation to the light intensity distribution and has a line-shaped beam cross section in the processing plane, wherein the homogenization system comprises a first homogenization arrangement that homogenizes along the short axis and a second homogenization arrangement for homogenization along the long axis, each of the homogenization arrangements comprises optical elements that split the laser beam into a multiplicity of partial beams and a condenser system that superposes the partial beams in a superposition plane, and the first homogenization arrangement comprises a first condenser system with at least one first mirror and the second homogenization arrangement comprises a second condenser system with at least one second mirror, wherein the first condenser system produces a real intermediate image at a distance upstream of the processing plane and an imaging system that images the intermediate image onto the processing plane is arranged between the intermediate image and the processing plane.

* * * * *